US012272777B2

(12) United States Patent
Zhou

(10) Patent No.: US 12,272,777 B2
(45) Date of Patent: Apr. 8, 2025

(54) DISPLAY PANEL AND MANUFACTURING METHOD THEREOF

(71) Applicant: TCL CHINA STAR OPTOELECTRONICS TECHNOLOGY CO., LTD., Guangdong (CN)

(72) Inventor: Shixin Zhou, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/623,831

(22) PCT Filed: Dec. 17, 2021

(86) PCT No.: PCT/CN2021/139352
§ 371 (c)(1),
(2) Date: Dec. 29, 2021

(87) PCT Pub. No.: WO2023/103058
PCT Pub. Date: Jun. 15, 2023

(65) Prior Publication Data

US 2024/0429356 A1 Dec. 26, 2024

(30) Foreign Application Priority Data

Dec. 10, 2021 (CN) ......................... 202111506405.9

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC ... H01L 33/62; H01L 25/0753; H01L 25/167; H01L 27/124; H01L 33/46; H01L 2933/0025; H01L 2933/0066
See application file for complete search history.

(56) References Cited

U.S. PATENT DOCUMENTS

2011/0002030 A1 1/2011 Wang
2012/0043575 A1 2/2012 Kim et al.
(Continued)

FOREIGN PATENT DOCUMENTS

CN 106662815 A 5/2017
CN 110018593 A 7/2019
(Continued)

OTHER PUBLICATIONS

Japanese Office Action issued in corresponding Japanese Patent Application No. 特願2021-577100 dated Feb. 13, 2024, pp. 1-4.
(Continued)

*Primary Examiner* — Victor A Mandala
(74) *Attorney, Agent, or Firm* — PV IP PC; Wei Te Chung

(57) ABSTRACT

A display panel includes a driving substrate, a plurality of bonding pads, a reflective layer, and a plurality of light-emitting units. The driving substrate includes a plurality of wirings of a driving circuit of the display panel. The bonding pads are disposed on the driving substrate and is electrically connected to the wirings of the driving circuit in the driving substrate. Every two of the bonding pads are arranged in pairs. Each of the bonding pads is frustum-shaped. The reflective layer is disposed between two adjacent pairs of the bonding pads. A material of the reflective layer includes photocuring reflective ink. Each of the light-emitting units is electrically connected to each pair of the bonding pads.

20 Claims, 5 Drawing Sheets

400 300 210 110 200 100 230 220

(51) Int. Cl.

| | |
|---|---|
| ***H01L 25/16*** | (2023.01) |
| ***H01L 27/12*** | (2006.01) |
| ***H01L 33/46*** | (2010.01) |

(52) U.S. Cl.

CPC ............ *H01L 27/124* (2013.01); *H01L 33/46* (2013.01); *H01L 2933/0025* (2013.01); *H01L 2933/0066* (2013.01)

(56) References Cited

U.S. PATENT DOCUMENTS

| | | | | |
|---|---|---|---|---|
| 2019/0189850 | A1 | 6/2019 | Wang et al. | |
| 2021/0043616 | A1* | 2/2021 | Jung | H01L 25/167 |
| 2022/0005897 | A1* | 1/2022 | Choi | H10K 50/856 |
| 2022/0093679 | A1* | 3/2022 | Jo | H01L 33/382 |
| 2022/0157917 | A1* | 5/2022 | Park | H10K 59/1213 |
| 2022/0170612 | A1* | 6/2022 | Park | G02F 1/133614 |
| 2022/0299823 | A1* | 9/2022 | Li | G02F 1/133611 |
| 2022/0310876 | A1* | 9/2022 | Ryu | H01L 33/0095 |
| 2022/0376150 | A1* | 11/2022 | Wang | G06F 3/044 |
| 2023/0144891 | A1* | 5/2023 | Xiao | H01L 33/005 362/97.1 |
| 2024/0178196 | A1* | 5/2024 | Tang | H01L 25/0753 |

FOREIGN PATENT DOCUMENTS

| | | | |
|---|---|---|---|
| CN | 210405499 | U | 4/2020 |
| CN | 111434003 | A | 7/2020 |
| CN | 111589674 | A | 8/2020 |
| CN | 212209546 | U | 12/2020 |
| CN | 112309243 | A | 2/2021 |
| CN | 113161332 | A | 7/2021 |
| CN | 113380847 | A | 9/2021 |
| CN | 113594146 | A | 11/2021 |
| JP | 2010087264 | A | 4/2010 |
| JP | 2013084906 | A | 5/2013 |
| WO | 2021236243 | A1 | 11/2021 |

OTHER PUBLICATIONS

International Search Report in International application No. PCT/CN2021/139352, mailed on Aug. 31, 2022.

Written Opinion of the International Search Authority in International application No. PCT/CN2021/139352, mailed on Aug. 31, 2022.

Japanese Office Action issued in corresponding Japanese Patent Application No. 特願2021-577100 dated Jul. 1, 2024, pp. 1-4.

* cited by examiner

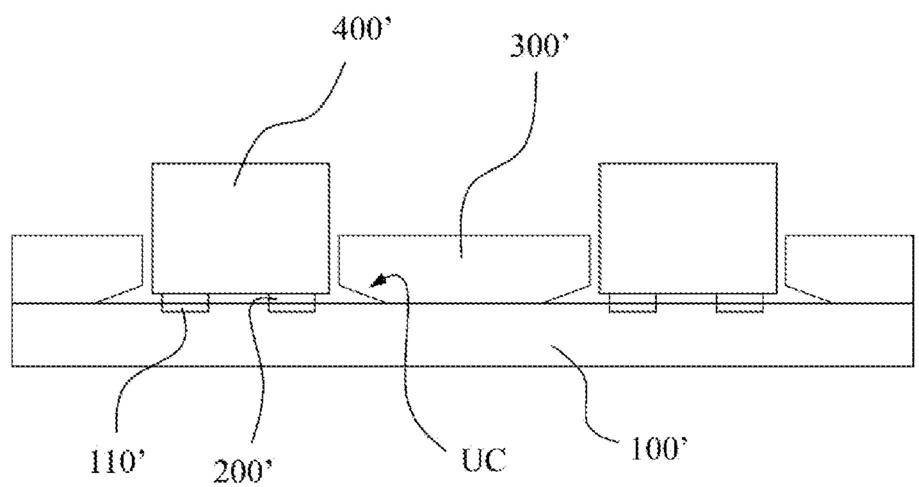
FIG. 1, Prior Art
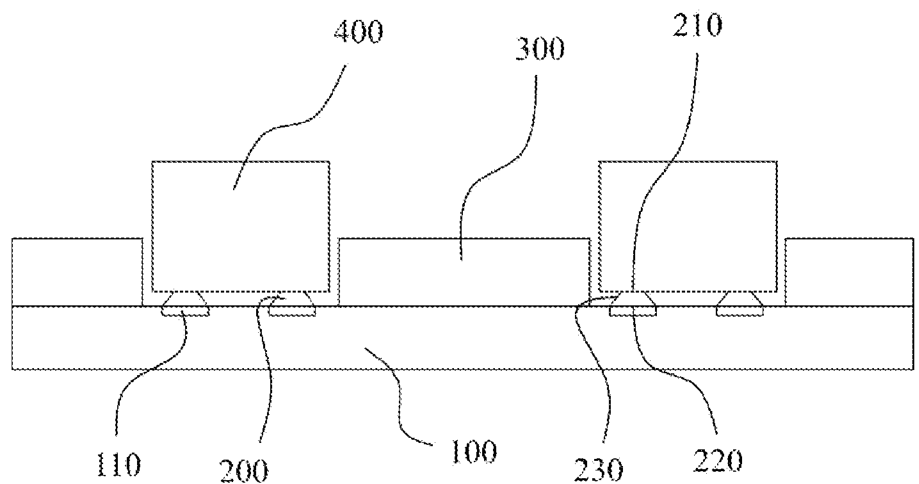
FIG. 2

DISPLAY PANEL AND MANUFACTURING METHOD THEREOF

FIELD OF INVENTION

The present invention is related to the field of display technology and specifically to a display panel including high reflectivity inclined surface bonding pads and manufacturing method thereof.

BACKGROUND OF INVENTION

With development of display technology, various types of display panels have emerged. Compared with liquid crystal (LC) display technology and organic light-emitting diode (OLED) display technology, mini-light-emitting diode (mini-LED) display technology has advantages of better response speed, display color gamut, contrast, resolution, and energy consumption performance. In addition, the mini-light-emitting diode display technology can further achieve precise dimming with an ultra-high number of partitions, so its development prospects are promising, and it will become a layout hot spot of major display panel manufacturers.

In a display panel applying the mini-light-emitting diode display technology, in order to increase a brightness and light extraction efficiency and reduce energy consumptions, the display panel in prior art is coated with a layer of reflective ink on a surface of a driving substrate to make light emitted by mini-light-emitting diodes in the display panel is reflected as much as possible. A reflectivity of the display panel can be adjusted by adjusting a coating thickness of the reflective ink and a precision of openings. Currently, the most commonly used manufacturing method of the reflective ink is to coat the reflective ink on the driving substrate of the display panel by inkjet printing or screen printing. Furthermore, the reflective ink is cured by exposure and development, and the openings are defined to expose a plurality of bonding pads configured to bond the mini-light-emitting diodes.

Please refer to FIG. 1, which is a partial structural schematic diagram of the display panel in the prior art. The display panel includes the driving substrate 100', the bonding pads 200', the reflective ink 300', and the mini-light-emitting diodes 400'. Each pair of the bonding pads 200' is electrically connected to one of the mini-light-emitting diodes 400' and a plurality of wirings 110' in the driving substrate 100'. The reflective ink 300' is disposed between two adjacent pairs of the bonding pads 200' to reflect the light emitted by the mini-light-emitting diodes 400'.

In the prior art, in order to increase the reflectivity of the display panel as much as possible, the coating thickness of the reflective ink is designed to be about 60 microns. However, because the reflective ink 300' is a photocurable material, a portion of the reflective ink 300' adjacent to a top surface can be completely cured by being sufficiently exposed to light, but a portion of the reflective ink 300' adjacent to a bottom surface cannot be completely cured due to insufficient light exposure. The incompletely cured portion of the reflective ink 300' will be washed away by developer in a subsequent manufacturing process, thereby forming undercut-shaped structures UC as shown in FIG. 1. According to calculations of inventor's simulation experiments, this defect of the undercut-shaped structures UC of the reflective ink 300' causes the reflectivity of the display panel to drop by 15% to 20%, which seriously reduces a display effect of the display panel.

The display panel in the prior art has a technical problem that the reflective ink cannot be sufficiently cured, and therefore a display panel including high reflectivity inclined surface bonding pads is required to solve the above technical problem.

SUMMARY OF INVENTION

The present invention provides a display panel including high reflectivity inclined surface bonding pads. The display panel includes a driving substrate, a plurality of bonding pads, a reflective layer, and a plurality of light-emitting units. The driving substrate includes a plurality of wirings of a driving circuit of the display panel. The bonding pads are disposed on the driving substrate and is electrically connected to the wirings of the driving circuit in the driving substrate. Every two of the bonding pads are arranged in pairs. Each of the bonding pads is frustum-shaped. The reflective layer is disposed between two adjacent pairs of the bonding pads. A material of the reflective layer includes photocuring reflective ink. Each of the light-emitting units is electrically connected to each pair of the bonding pads.

In an embodiment, an angle between at least one side surface and a bottom surface of each of the frustum-shaped bonding pads ranges from 40 degrees to 50 degrees.

In this embodiment, the angle between the at least one side surface and the bottom surface of each of the frustum-shaped bonding pads is 45 degrees.

In an embodiment, each of the bonding pads is pyramidal-frustum-shaped or conical-frustum-shaped.

In an embodiment, a material of the bonding pads includes copper, aluminum, silver, cobalt, palladium, iron, cadmium, nickel, or a combination thereof.

In an embodiment, a height of each of the bonding pads ranges from 8 microns to 10 microns.

In this embodiment, a thickness of the reflective layer ranges from 55 microns to 60 microns.

The present invention further provides a manufacturing method of a display panel. The manufacturing method of the display panel includes steps of:

- forming a driving substrate, wherein the driving substrate includes a plurality of wirings of a driving circuit of the display panel;
- forming a plurality of bonding pads on the driving substrate, wherein the bonding pads are electrically connected to the wirings of the driving circuit in the driving substrate, every two of the bonding pads are arranged in pairs, and each of the bonding pads is frustum-shaped;
- forming a reflective layer on the driving substrate, wherein the reflective layer is formed between two adjacent pairs of the bonding pads, and a material of the reflective layer includes photocuring reflective ink; and
- electrically connecting a light-emitting unit to each pair of the bonding pads.

In an embodiment, an angle between at least one side surface and a bottom surface of each of the frustum-shaped bonding pads ranges from 40 degrees to 50 degrees.

In this embodiment, the angle between the at least one side surface and the bottom surface of each of the frustum-shaped bonding pads is 45 degrees.

In an embodiment, each of the bonding pads is pyramidal-frustum-shaped or conical-frustum-shaped.

In an embodiment, a material of the bonding pads includes copper, aluminum, silver, cobalt, palladium, iron, cadmium, nickel, or a combination thereof.

In an embodiment, a height of each of the bonding pads ranges from 8 microns to 10 microns.

In this embodiment, a thickness of the reflective layer ranges from 55 microns to 60 microns.

In an embodiment, the step of forming a plurality of bonding pads on the driving substrate includes steps of:

forming an electroplating seed layer on a surface of the driving substrate;

forming a photoresist on the electroplating seed layer;

patterning the photoresist to define a frustum-shaped cavity in a region where each of the bonding pads to be formed;

electroplating the photoresist and the electroplating seed layer to form the bonding pads filling the cavities in the photoresist;

removing the photoresist; and etching the bonding pads and the electroplating seed layer to remove a portion of the electroplating seed layer outside the regions formed with the bonding pads.

In an embodiment, a thickness of the electroplating seed layer ranges from 0.5 microns to 1 micron.

In an embodiment, a material of the electroplating seed layer includes copper, aluminum, silver, cobalt, palladium, iron, cadmium, nickel, or a combination thereof.

In an embodiment, a material of the photoresist includes a negative photoresist.

In an embodiment, a depth of the cavity is greater than or equal to a height of each of the bonding pads, and a difference between the depth of the cavity and the height of each of the bonding pads ranges from 0 micron to 5 microns.

In an embodiment, a thickness of the photoresist ranges from 10 microns to 12 microns.

The present invention provides the display panel and the manufacturing method thereof. The display panel includes the driving substrate, the bonding pads, the reflective layer, and the light-emitting units. The driving substrate includes the wirings of the driving circuit of the display panel. The bonding pads are disposed on the driving substrate and is electrically connected to the wirings of the driving circuit in the driving substrate. Every two of the bonding pads are arranged in pairs. Each of the bonding pads is frustum-shaped. The reflective layer is disposed between two adjacent pairs of the bonding pads. The material of the reflective layer includes photocuring reflective ink. Each of the light-emitting units is electrically connected to each pair of the bonding pads. Since each of the bonding pads is frustum-shaped, the present invention can utilize the bonding pads including the high reflectivity inclined surfaces to solve a technical problem that photocuring reflective ink of a reflective layer of a display panel in prior art cannot be completely cured.

DESCRIPTION OF DRAWINGS

FIG. 1 is a partial structural schematic diagram of a display panel in prior art.

FIG. 2 is a partial structural schematic diagram of a display panel of the present invention.

DETAILED DESCRIPTION OF EMBODIMENTS

Figure 3:
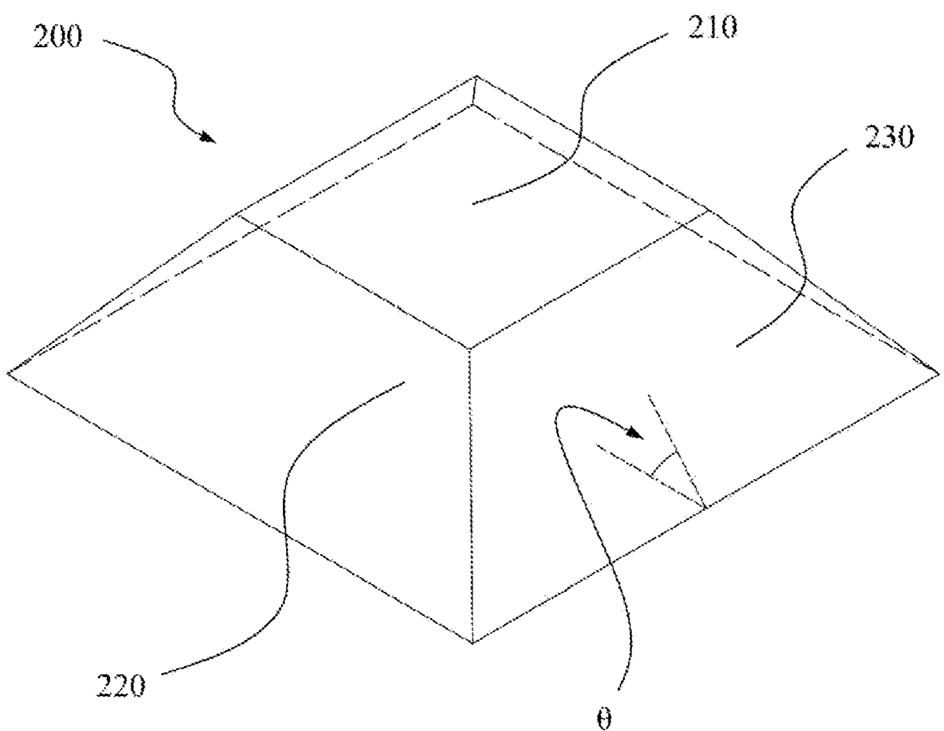
FIG. 3 is a three-dimensional schematic diagram of a bonding pad of the display panel of the present invention.

In order to make above purposes, features, and advantages of the present invention more obvious and understandable, the following is a detailed description of preferred embodiments of the present invention in conjunction with accompanying drawings.

Please refer to FIG. 2, which is a partial structural schematic diagram of a display panel of the present invention. The display panel includes a driving substrate 100, a plurality of bonding pads 200, and a plurality of light-emitting units 400. The driving substrate 100 includes a plurality of wirings 110 of a driving circuit of the display panel. The bonding pads 200 are disposed on the driving substrate 100 and is electrically connected to the wirings 110 of the driving circuit in the driving substrate 100. The bonding pads 200 are configured to bond the light-emitting units 400, and every two of the bonding pads 200 are arranged in pairs. Each of the light-emitting units 400 is electrically connected to each pair of the bonding pads 200, which means that each pair of the bonding pads 200 includes an anode and a cathode to electrically connect the wirings 110 of the driving substrate 100.

In order to increase a brightness and light-emitting efficiency of the display panel and reduce energy consumptions of the display panel, the present invention provides a reflective layer 300 on the driving substrate 100 of the display panel, so that light emitted by the light-emitting units 400 is reflected out of the display panel as much as possible. In an embodiment, the reflective layer 300 is disposed between two adjacent pairs of the bonding pads 200, so as to surround a region where one of the light-emitting units 400 will be bond. A material of the reflective layer 300 includes reflective ink whose main color is white, and preferably, includes photocuring reflective ink. In inventor's simulation experiments, when a thickness of the reflective layer 300 ranges from 55 microns to 60 microns, a reflectivity can reach more than 92.5%.

In order to enable the photocuring reflective ink of the reflective layer 300 to be completely irradiated to light during an exposure process, the present invention configures a shape of each of the bonding pads 200 to be frustum-shaped. A frustum is formed by truncating a top of a general cone, and a truncation plane is parallel to a bottom surface 220 of the cone. The frustum is also called a truncated cone, a frustum, and a mesa shape.

Since at least one side surface 230 of each of the bonding pads 200 of the present invention is configured as an inclined surface, in the process in which the photocuring reflective ink of the reflective layer 300 is exposed, curing light can be reflected to a portion of the reflective layer 300 adjacent to a bottom surface. In this way, not only a portion of the reflective layer 300 adjacent to a top surface can be completely cured by being sufficiently exposed to light, but also the portion of the reflective layer 300 adjacent to the bottom surface can be completely cured by being sufficiently exposed to light reflected by the bonding pads 200.

Please refer to FIG. 3, which is a three-dimensional schematic diagram of one of the bonding pads 200 of the display panel of the present invention. In this embodiment, each of the bonding pads 200 is pyramidal-frustum-shaped, and preferably, it may be square-pyramidal-frustum-shaped. Each of the bonding pads 200 includes a top surface 210, a bottom surface 220, and four side surfaces 230. In each of the bonding pads 200, the top surface 210 is parallel to the bottom surface 220, and four side surfaces 230 connect the top surface 210 and the bottom surface 220. As shown in FIG. 3, the present invention configures one of the side surfaces 230 of each of the bonding pads 200 to have an included angle θ with the bottom surface 220 in a range of 40 degrees to 50 degrees, preferably 45 degrees.

Figure 4:
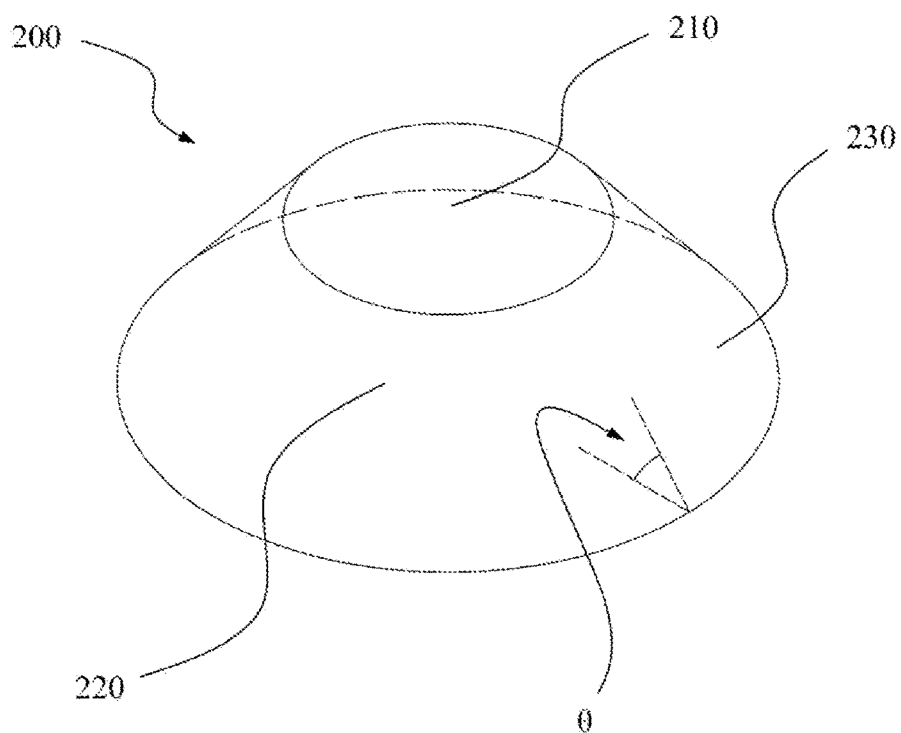
FIG. 4 is another three-dimensional schematic diagram of another bonding pad of the display panel of the present invention.

Please refer to FIG. 4, which is another three-dimensional schematic diagram of another one of the bonding pads 200 of the display panel of the present invention. In this embodiment, each of the bonding pads 200 is conical-frustum-shaped, and preferably, it may be right-conical-frustum-shaped. Each of the bonding pads 200 includes a top surface 210, a bottom surface 220, and a side surface 230. In each of the bonding pads 200, the top surface 210 is parallel to the bottom surface 220, and the side surface 230 connects the top surface 210 and the bottom surface 220. As shown in FIG. 4, the present invention configures the side surface 230 of each of the bonding pads 200 to have an included angle θ with the bottom surface 220 in a range of 40 degrees to 50 degrees, preferably 45 degrees.

Compared with the one of the pyramidal-frustum-shaped bonding pads 200 shown in FIG. 3, the one of the conical-frustum-shaped bonding pads 200 can more evenly reflect the curing light to the portion of the reflective layer 300 adjacent to the bottom surface of the reflective layer 300, so that the photocuring reflective ink of the reflective layer 300 is cured more completely.

In an embodiment of the present invention, in order to reflect the curing light to the portion of the reflective layer 300 adjacent to the bottom surface as much as possible to completely cure the photocuring reflective ink of the reflective layer 300, so a material of the bonding pads 200 is configured as a metal material with a high reflectivity. Preferably, the material of the bonding pads 200 includes copper, aluminum, silver, cobalt, palladium, iron, cadmium, nickel, or a combination thereof. In addition, the material of the bonding pads 200 also has high conductivity, so the bonding pads 200 can bond the light-emitting units 400 to stably supply currents to the light-emitting units 400.

It should be explained that through in inventor's simulation experiments, when a thickness of the reflective layer 300 is configured to range from 55 microns to 60 microns, there may be a defect of undercut-shaped structures with a height of about 10 microns after the reflective layer 300 is performed with a patterning process of the prior art. Therefore, in the present invention, at least one side surface 230 of each of the bonding pads 200 is configured to have the included angle θ with the bottom surface 220 in the range of 40 degrees to 50 degrees, and each of the bonding pads 200 is accordingly configured to range from 8 microns to 10 microns.

Beneficial to a structure design of the bonding pads 200 of the present invention, the photocuring reflective ink of the reflective layer 300 can be completely cured after the patterning process, thereby preventing the defect of the undercut-shaped structure formed by an incomplete curing of the reflective layer of the display panel in the prior art. This enables the reflective layer 300 of the display panel of the present invention to achieve a reflectivity above a theoretical value, which means that the reflectivity of the reflective layer 300 reaches above 92.5%, thereby enhancing a display effect of the display panel and reducing the energy consumptions of the display panel.

The present invention further provides a manufacturing method of a display panel. The manufacturing method of the display panel includes the following steps S1-S4. Please refer to FIGS. 5-12, which are structural schematic diagrams showing the display panel of the present invention at different manufacturing processes.

S1, forming a driving substrate. The driving substrate 100 includes a plurality of wirings 110 of a driving circuit of the display panel.

S2, forming a plurality of bonding pads 200 on the driving substrate 100. The bonding pads 200 are electrically connected to the wirings 110 of the driving circuit in the driving substrate 100. In order to form the bonding pads 200, this step further includes the following steps S21-S26.

Figure 5:
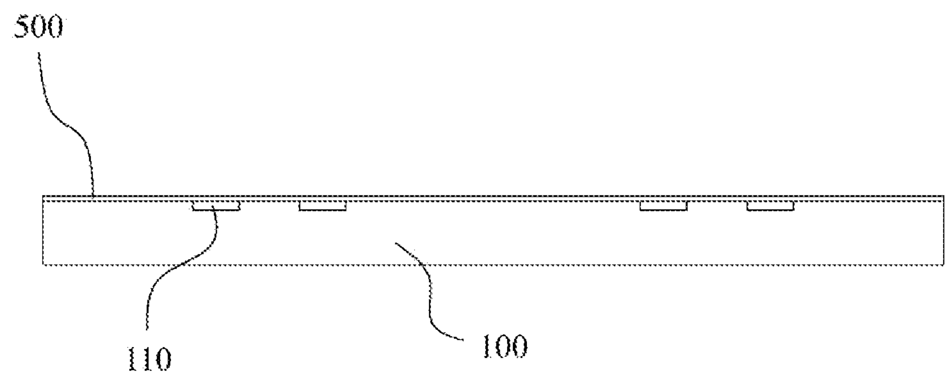
FIGS. 5-12 are structural schematic diagrams showing the display panel of the present invention at different manufacturing processes.

S21, forming an electroplating seed layer 500 on a surface of the driving substrate 100. As shown in FIG. 5, in order to form the metal bonding pads 200 on the surface of the non-metal driving substrate 100, a metal thin film of the electroplating seed layer 500 must first be formed thereon. A thickness of the electroplating seed layer ranges from 0.5 microns to 1 micron, and preferably, the thickness of the electroplating seed layer 500 may be 0.6 microns.

In this step, in order to homogenize the bonding pads 200 with the electroplating seed layer 500 to be formed later, the electroplating seed layer 500 can be made of copper, aluminum, silver, cobalt, palladium, iron, cadmium, nickel, or a combination thereof that are same as a material of the bonding pads 200.

Figure 6:
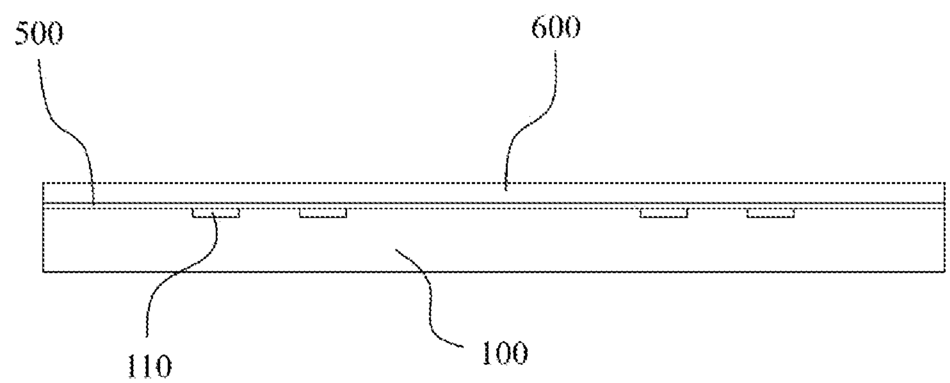

S22, forming a photoresist 600 on the electroplating seed layer 500. As shown in FIG. 6, the present invention then forms the photoresist 600 with a thickness ranging from 10 microns to 12 microns on the electroplating seed layer 500. Since a desired height of the bonding pads 200 ranges from 8 microns to 10 microns, a desired thickness of the photoresist 600 of the present invention is configured to be greater than or equal to the desired height of the bonding pads 200.

Figure 7:
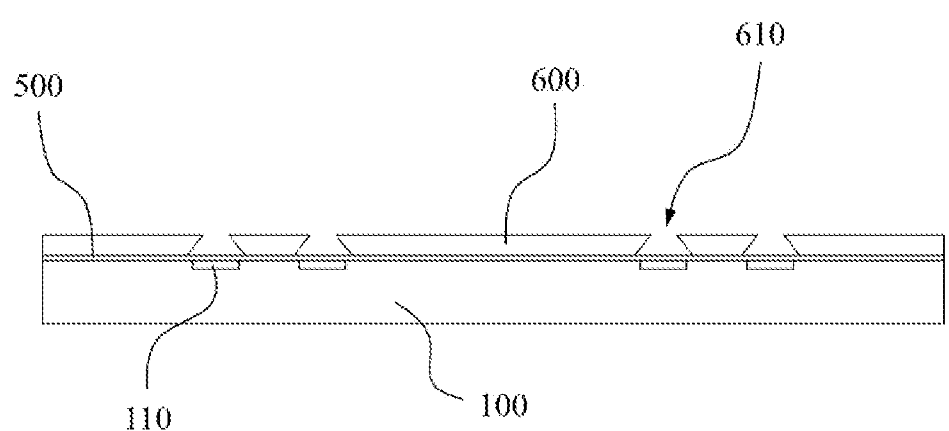

S23, patterning the photoresist 600 to define a frustum-shaped cavity 610 in a region where each of the bonding pads 200 to be formed. As shown in FIG. 7, through a patterning process including photomask exposure, development, and washing, the photoresist 600 is formed with the frustum-shaped cavities 610 to provide spaces for the bonding pads 200 to be subsequently formed. In an embodiment, a depth of the cavity 610 is greater than or equal to the desired height of each of the bonding pads 200. Furthermore, a difference between the depth of the cavity 610 and the desired height of each of the bonding pads 200 ranges from 0 microns to 5 microns.

It should be explained that a material of the photoresist 600 of the present invention includes a negative photoresist 600. Preferably, the negative photoresist 600 can be a commercially available model such as Merck CPT-100. Due to characteristics of the negative photoresist 600, undercut-shaped structures as shown in FIG. 7 will be formed after the photoresist 600 is patterned. A shape of each of the undercut-shaped structures, such as bevel angles, etc., can be adjusted by exposure degree, development time, or baking time of the photoresist 600. In this way, the desired frustum-shaped cavities 610 can be formed according to actual implementation requirements.

Figure 8:
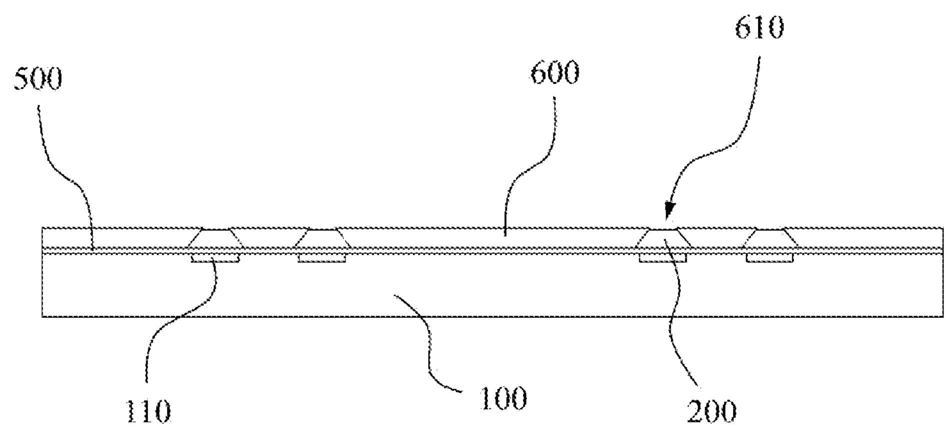

S24, electroplating the photoresist 600 and the electroplating seed layer 500 to form the bonding pads 200 filling the cavities 610 in the photoresist 600. As shown in FIG. 8, after the photoresist 600 has defined with the cavities 610, the material of the bonding pads 200, such as copper, aluminum, silver, cobalt, palladium, iron, cadmium, nickel, or a combination thereof, can be filled into the frustum-shaped cavities 610 under a guidance of the electroplating seed layer 500 through an electroplating process, such as wet plating, so as to form the frustum-shaped bonding pads 200.

Figure 9:
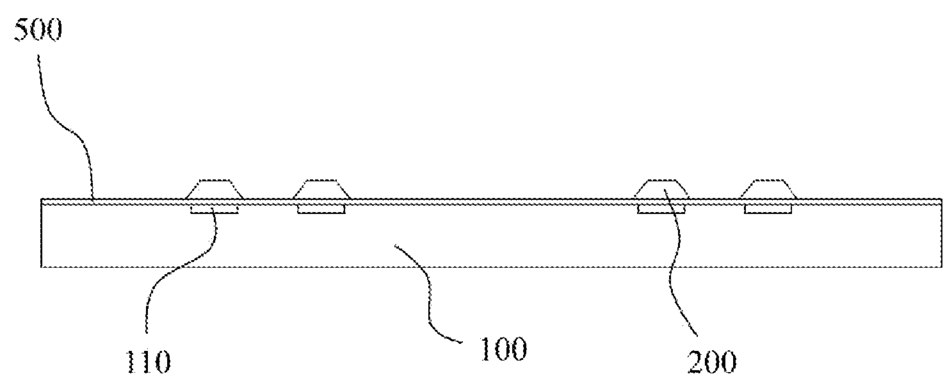

S25, removing the photoresist 600. As shown in FIG. 9, after the bonding pads 200 are formed in the cavities 610 of the photoresist 600, the photoresist 600 can be peeled off from the electroplating seed layer 500 and the bonding pads 200.

Figure 10:
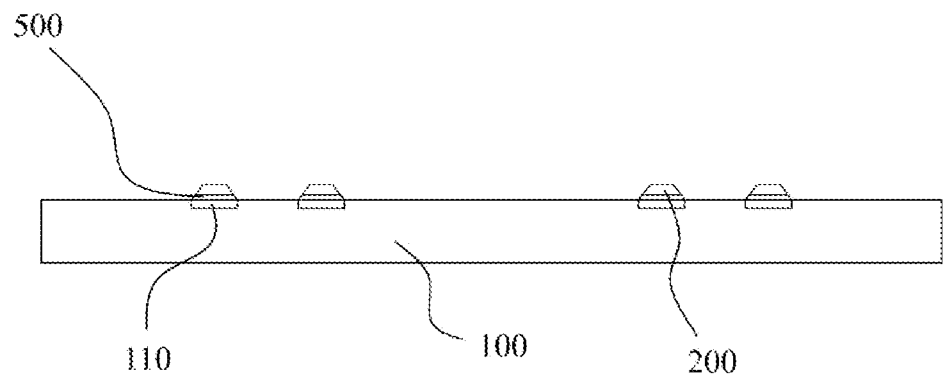

S26, etching the bonding pads 200 and the electroplating seed layer 500 to remove a portion of the electroplating seed layer 500 outside the regions formed with the bonding pads 200. As shown in FIG. 10, since step S21 first forms an entire surface of the electroplating seed layer 500, in this situation, the wirings 110 of the driving substrate 100 are all electrically connected to the electroplating seed layer 500. In order to enable the bonding pads 200 to insulate from each other and electrically connect the wirings 110 of the driving circuit in the driving substrate 100, the portion of the electroplating seed layer 500 outside the regions formed with the bonding pads 200 must be removed.

In this step, by etching an entire surface of the bonding pads 200 and the electroplating seed layer 500, the portion of the electroplating seed layer 500 outside the region formed with the bonding pads 200 has been removed. Since a thickness of the electroplating seed layer 500 is approximately 0.6 microns, it is only necessary to sacrifice a shallow surface of the bonding pads 200 to achieve insulation between the bonding pads 200.

Figure 11:
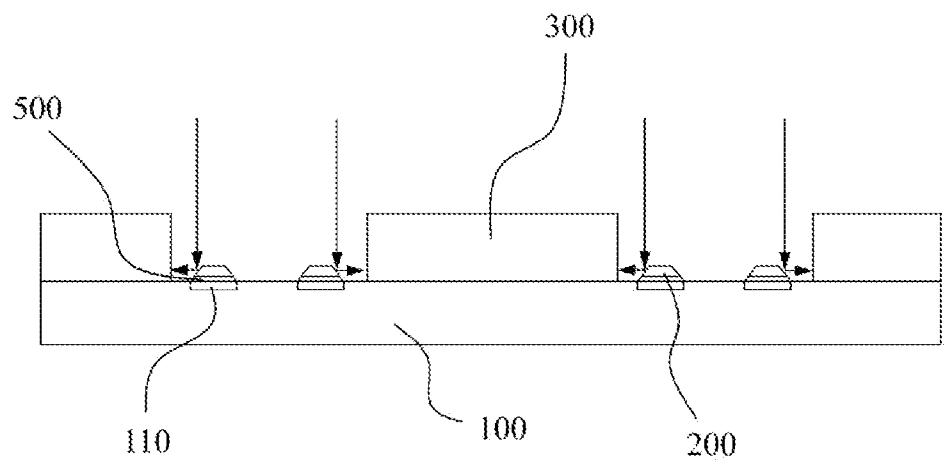

S3, forming a reflective layer 300 on the driving substrate 100. As shown in FIG. 11, after step S2 is completed, the reflective layer 300 will be formed between two adjacent pairs of the bonding pads 200. Photocuring reflective ink of the reflective layer 300 is coated on the driving substrate 100 through inkjet printing or screen printing, and followed with a pre-baking process, an exposure process, a development process, and a main-baking process to completely cure the photocuring reflective ink of the reflective layer 300. In this step, preferably, the exposure process may be a laser direct imaging (LDI) process.

As shown in FIG. 11, when the photocuring reflective ink of the reflective layer 300 is performed with the exposure process, since at least one side surface 230 of each of the bonding pads 200 of the present invention is configured as an inclined surface, the photocuring reflective ink of the reflective layer 300 can reflect curing light to a portion of the reflective layer 300 adjacent to a bottom surface during the exposure process. In this way, not only a portion of the reflective layer 300 adjacent to a top surface can be completely cured by being sufficiently exposed to light, but also the portion of the reflective layer 300 adjacent to the bottom surface can be completely cured by being sufficiently exposed to light reflected by the bonding pads 200.

Figure 12:
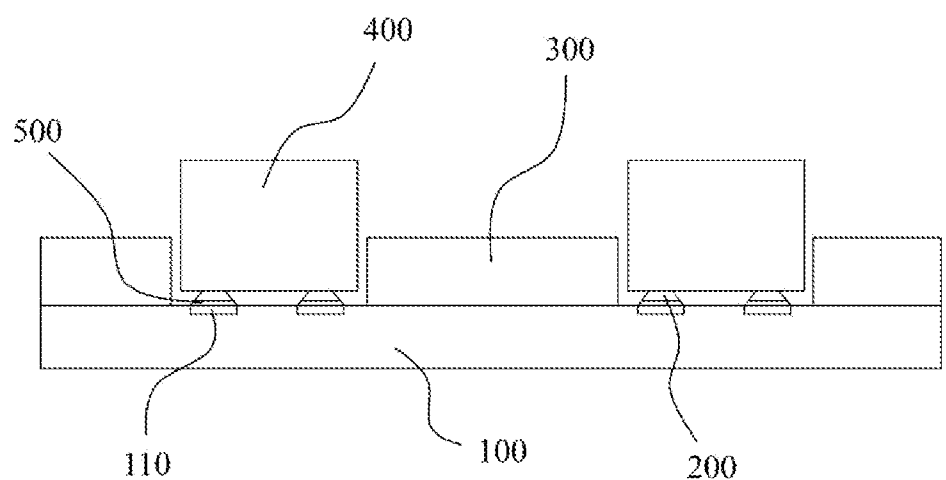

S4, electrically connecting a light-emitting unit 400 to each pair of the bonding pads 200. As shown in FIG. 12, after step S3 is completed, the light-emitting units 400 can be electrically connected to the bonding pads 200. In this step, the light-emitting unit 400 is bonded to each pair of the bonding pads 200 through a mass reflow bonding process.

The present invention provides the display panel and the manufacturing method thereof. The display panel includes the driving substrate 100, the bonding pads 200, the reflective layer 300, and the light-emitting units 400. The driving substrate 100 includes the wirings 110 of the driving circuit of the display panel. The bonding pads 200 are disposed on the driving substrate 100 and is electrically connected to the wirings 110 of the driving circuit in the driving substrate 100. Every two of the bonding pads 200 are arranged in pairs. Each of the bonding pads 200 is frustum-shaped. The reflective layer 300 is disposed between two adjacent pairs of the bonding pads 200. The material of the reflective layer 300 includes photocuring reflective ink. Each of the light-emitting units 400 is electrically connected to each pair of the bonding pads 200. Since each of the bonding pads 200 is frustum-shaped, the present invention can utilize the bonding pads 200 including the high reflectivity inclined surfaces to solve a technical problem that photocuring reflective ink of a reflective layer of a display panel in prior art cannot be completely cured.

The description above are only preferred embodiments of the invention. It should be pointed out that to those of ordinary skill in the art, various improvements and embellishments may be made without departing from the principle of the present invention, and these improvements and embellishments are also deemed to be within the scope of protection of the present invention.

What is claimed is:

1. A display panel, comprising:

a driving substrate comprising a plurality of wirings of a driving circuit of the display panel;

a plurality of bonding pads disposed on the driving substrate and electrically connected to the wirings of the driving circuit in the driving substrate, wherein every two of the bonding pads are arranged in pairs, and each of the bonding pads is frustum-shaped;

a reflective layer disposed between two adjacent pairs of the bonding pads, wherein a material of the reflective layer comprises photocuring reflective ink; and a plurality of light-emitting units, wherein each of the light-emitting units is electrically connected to each pair of the bonding pads.

2. The display panel according to claim 1, wherein an angle between at least one side surface and a bottom surface of each of the frustum-shaped bonding pads ranges from 40 degrees to 50 degrees.

3. The display panel according to claim 2, wherein the angle between the at least one side surface and the bottom surface of each of the frustum-shaped bonding pads is 45 degrees.

4. The display panel according to claim 1, wherein each of the bonding pads is pyramidal-frustum-shaped or conical-frustum-shaped.

5. The display panel according to claim 1, wherein a material of the bonding pads comprises copper, aluminum, silver, cobalt, palladium, iron, cadmium, nickel, or a combination thereof.

6. The display panel according to claim 1, wherein a height of each of the bonding pads ranges from 8 microns to 10 microns.

7. The display panel according to claim 6, wherein a thickness of the reflective layer ranges from 55 microns to 60 microns.

8. A manufacturing method of a display panel, comprising steps of:

forming a driving substrate, wherein the driving substrate comprises a plurality of wirings of a driving circuit of the driving substrate;

forming a plurality of bonding pads on the driving substrate, wherein the bonding pads are electrically connected to the wirings of the driving circuit in the driving substrate, every two of the bonding pads are arranged in pairs, and each of the bonding pads is frustum-shaped;

forming a reflective layer on the driving substrate, wherein the reflective layer is formed between two adjacent pairs of the bonding pads, and a material of the reflective layer comprises photocuring reflective ink; and electrically connecting a light-emitting unit to each pair of the bonding pads.

9. The manufacturing method of the display panel according to claim 8, wherein an angle between at least one side surface and a bottom surface of each of the frustum-shaped bonding pads ranges from 40 degrees to 50 degrees.

10. The manufacturing method of the display panel according to claim 9, wherein the angle between the at least one side surface and the bottom surface of each of the frustum-shaped bonding pads is 45 degrees.

11. The manufacturing method of the display panel according to claim 8, wherein each of the bonding pads is pyramidal-frustum-shaped or conical-frustum-shaped.

12. The manufacturing method of the display panel according to claim 8, wherein a material of the bonding pads comprises copper, aluminum, silver, cobalt, palladium, iron, cadmium, nickel, or a combination thereof.

13. The manufacturing method of the display panel according to claim 8, wherein a height of each of the bonding pads ranges from 8 microns to 10 microns.

14. The manufacturing method of the display panel according to claim 13, wherein a thickness of the reflective layer ranges from 55 microns to 60 microns.

15. The manufacturing method of the display panel according to claim 8, wherein the step of forming a plurality of bonding pads on the driving substrate comprises steps of:

forming an electroplating seed layer on a surface of the driving substrate;

forming a photoresist on the electroplating seed layer;

patterning the photoresist to define a frustum-shaped cavity in a region where each of the bonding pads to be formed;

electroplating the photoresist and the electroplating seed layer to form the bonding pads filling the cavities in the photoresist;

removing the photoresist; and etching the bonding pads and the electroplating seed layer to remove a portion of the electroplating seed layer outside the regions formed with the bonding pads.

16. The manufacturing method of the display panel according to claim 15, wherein a thickness of the electroplating seed layer ranges from 0.5 microns to 1 micron.

17. The manufacturing method of the display panel according to claim 15, wherein a material of the electroplating seed layer comprises copper, aluminum, silver, cobalt, palladium, iron, cadmium, nickel, or a combination thereof.

18. The manufacturing method of the display panel according to claim 15, wherein a material of the photoresist comprises a negative photoresist.

19. The manufacturing method of the display panel according to claim 15, wherein a depth of the cavity is greater than or equal to a height of each of the bonding pads, and a difference between the depth of the cavity and the height of each of the bonding pads ranges from 0 micron to 5 microns.

20. The manufacturing method of the display panel according to claim 15, wherein a thickness of the photoresist ranges from 10 microns to 12 microns.

* * * * *